United States Patent
Chua et al.

(10) Patent No.: US 9,395,621 B2
(45) Date of Patent: Jul. 19, 2016

(54) PELLICLES AND DEVICES COMPRISING A PHOTOMASK AND THE PELLICLE

(71) Applicant: GLOBALFOUNDRIES Singapore Pte. Ltd., Singapore (SG)

(72) Inventors: Gek Soon Chua, Singapore (SG); Soon Yoeng Tan, Singapore (SG); Ngar Chen Stella Lau, Singapore (SG); Sia Kim Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/543,069

(22) Filed: Nov. 17, 2014

(65) Prior Publication Data

US 2016/0139502 A1    May 19, 2016

(51) Int. Cl.
*G03F 1/64* (2012.01)
(52) U.S. Cl.
CPC ........................................ *G03F 1/64* (2013.01)
(58) Field of Classification Search
CPC ..................................... G03F 1/62; G03F 1/64
USPC .............................................................. 430/5
See application file for complete search history.

(56) References Cited

U.S. PATENT DOCUMENTS

| | | | | |
|---|---|---|---|---|
| 6,744,562 B2 * | 6/2004 | Okada | ....................... | G03F 1/64 355/53 |
| 8,221,944 B2 * | 7/2012 | Shirasaki | .................. | G03F 1/64 430/5 |
| 8,449,966 B2 * | 5/2013 | Sekihara | ................... | G03F 1/62 428/14 |
| 9,195,130 B2 * | 11/2015 | Yamada | .................. | G03F 1/142 |
| 2014/0315122 A1 * | 10/2014 | Sekihara | ................... | G03F 1/22 430/5 |

* cited by examiner

*Primary Examiner* — Christopher Young
(74) *Attorney, Agent, or Firm* — Ingrassia Fisher & Lorenz, P.C.

(57) ABSTRACT

A pellicle is provided for use with a lithographic photomask during manufacture of semiconductor devices, printed circuit boards, liquid crystal displays, etc. The pellicle has a pellicle frame comprising four pellicle walls that define a trapezoidal area sized and shaped to correspond to a pattern area of a lithographic photomask; and a pellicle film extending across the trapezoidal area and affixed to a film-side edge of the pellicle frame; wherein any one of the four pellicle walls has a vent hole therethrough, the vent hole being located proximate a corner of the frame and if matter passes through the vent hole, the foreign matter will not obstruct the pattern area during use of the lithographic photomask.

20 Claims, 1 Drawing Sheet

PELLICLES AND DEVICES COMPRISING A PHOTOMASK AND THE PELLICLE

TECHNICAL FIELD

The technical field relates to pellicles and devices comprising pellicles and photomasks used during photolithography. More particularly, the technical field relates to pellicles that prevent foreign matter from entering a pattern area of a photomask during photolithography and devices with such pellicles and photomasks.

BACKGROUND

Photolithography is a technique for fabricating devices such as a semiconductor device, a liquid crystal display device, an image capturing device (e.g., a charge coupled device, i.e., a CCD), or a thin film magnetic head and the like. Generally, photolithography involves transferring a pattern from a pattern area on a photomask to the surface of a thin film or the bulk of a substrate coated with a photoresist material. This is accomplished by aligning the coated substrate with the photomask and then exposing the aligned components repeatedly to light. The wavelength of light used depends on the composition of the photoresist material. If foreign matter such as dust or other particulates comes to rest on the pattern area of the photomask, the resulting pattern on the substrate will very likely be damaged and the substrate defective and unusable.

A protective apparatus, known as a pellicle, is often affixed to the photomask to cover the pattern area and prevent foreign matter from settling on, or remaining floating above, the pattern area during the manufacture process. The pellicle has a pellicle frame comprising four walls which define a trapezoidal area that is substantially commensurate with the pattern area on the photomask to be protected. The frame is made of a material that is semi-rigid, as well as opaque and inert to light, including aluminum, aluminum alloys, stainless steel, polyethylene, and similar materials. The pellicle also includes a pellicle film affixed to an upper edge of the frame and extending across the area defined by the frame.

At least one vent hole is typically provided in at least one of the frame walls to allow for equalizing the pressure between air contained in a space created between the photomask surface and a pellicle affixed thereto and ambient air surrounding the photomask. A filter is often used to cover the vent hole for preventing foreign matter from entering the vent hole and settling on, or floating above, the pattern area.

In the device fabrication process that produces semiconductor wafers, a simple surface air spray, such as nitrogen air gun spray, may be performed to enhance the entire photomask substrate surface cleanness. This procedure, however, sometimes introduces foreign matter into the space between the photomask and the pellicle, through the vent hole, where it may undesirably settle on or float above the pattern area of the photomask. To prevent such introduction of foreign matter through the vent hole, pellicle manufacturers typically caution that the nitrogen or air source should be at least 10 millimeters away from the filter covering the vent hole, and that the pressure of the nitrogen or air must be 0.20 megapascals (MPa) or less, and that the duration of blowing the nitrogen or air must be less than 10 seconds. Nonetheless, even adherence to these precautions does not guarantee no foreign matter will enter through the vent hole and filter. It has been found that the problem of foreign matter entering through the vent hole and filter occurs more than most other manufacturing issues that arise when using pellicles with photomasks.

Moreover, testing has shown that when floating particles were inadvertently introduced through the vent hole and under the pellicle film, most of the floating particles were located close to the vent hole. Thus, resolution of this issue clearly merits particular attention.

Moreover, the pellicle also has a mask-side edge located opposite the upper edge to which the pellicle film is affixed. The pellicle is typically affixed to the photomask with an adhesive between the mask-side edge and the photomask. Unfortunately, when the thickness of the frame walls is uniform from the mask-side edge to the pellicle film-side edge, it is often not possible to inspect the entire trapezoidal area of the photomask defined by the frame because a peripheral portion of the area proximate the mask-side edge of the frame is obstructed by shadow cast by the frame walls. This is undesirable since the devices being manufactured are typically very small and, therefore, the useful and accessible area on these devices must be maximized to maximize their value and efficiency. Furthermore, pattern areas on a photomask that are obstructed and cannot be inspected also cannot be subjected to quality control and guaranteed to function as intended, which means such obstructed areas are not useful, which diminishes the efficiency and value of the photomask.

Accordingly, it is desirable to provide a pellicle having improved ability to prevent foreign matter from settling on, or floating above, the pattern area of a photomask. It is also desirable to provide a pellicle having a larger unobstructed, inspectable area defined by the pellicle frame. Furthermore, other desirable features and characteristics will become apparent from the subsequent detailed description and the appended claims, taken in conjunction with the accompanying drawings and the following background.

BRIEF SUMMARY

Pellicles and devices comprising a photomask and the pellicle are provided herein. An exemplary embodiment provides a pellicle for use with a lithographic photomask during manufacture of semiconductor devices, printed circuit boards, liquid crystal displays, etc. More particularly, the pellicle comprises a pellicle frame comprising four pellicle walls that define a trapezoidal area sized and shaped to correspond to a pattern area of a lithographic photomask; and a pellicle film extending across the trapezoidal area and affixed to a film-side edge of the pellicle frame; wherein any one of the four pellicle walls has a vent hole therethrough, the vent hole being located a distance (d) from the corner of the frame, wherein if foreign matter passes through the vent hole, the foreign matter will not obstruct the pattern area during use of the lithographic photomask.

In another embodiment, the pellicle comprises: a pellicle frame comprising four pellicle walls that define a trapezoidal area sized and shaped to correspond to a pattern area of a lithographic photomask; and a pellicle film extending across the trapezoidal area and affixed to a film-side edge of the pellicle frame; wherein the film-side edge of the pellicle frame has a width that is smaller than a width of a mask-side edge of the pellicle frame located opposite the film-side edge.

Still another embodiment provides a device comprising: a lithography photomask comprising a pattern area and a peripheral border area extending around the pattern area; and a pellicle affixed to the photomask. Furthermore, the pellicle comprises, a pellicle frame comprising four pellicle walls that define a trapezoidal area sized and shaped to correspond to the pattern area of the lithographic photomask; a pellicle film extending across the trapezoidal area and affixed to a film-side edge of the pellicle frame; and a mask-side edge of the pellicle frame opposite the film-side edge; wherein any one of the four pellicle walls has a vent hole therethrough, the vent hole being located a distance (d) from the corner of the frame, wherein if foreign matter passes through the vent hole, the foreign matter will not obstruct the pattern area during use of the lithographic photomask; and wherein the pellicle is affixed to the photomask between the mask-side edge of the pellicle frame and the peripheral border area of the photomask.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Figure 1:
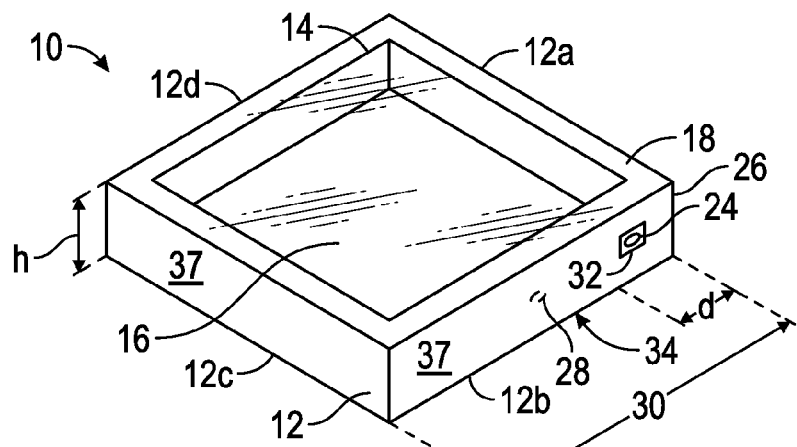
FIG. 1 is a perspective view of an exemplary embodiment of a pellicle showing the position of a relocated vent hole.
Figure 3:
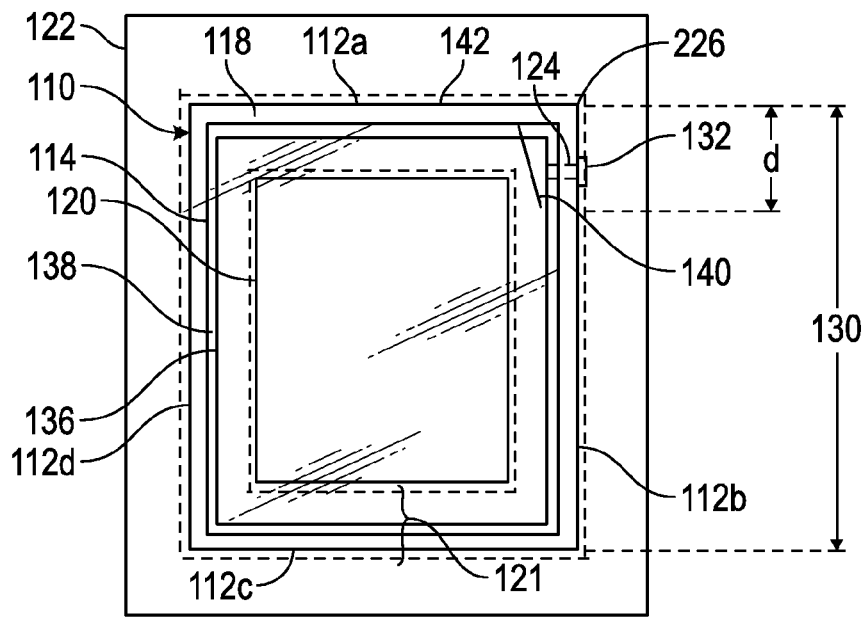
FIG. 3 is a top plan view of the embodiment shown in FIG. 2, showing an optional baffle extending across the vent hole.

FIG. 1 provides a perspective view of an exemplary embodiment of a pellicle 10 having a pellicle frame 12 formed by four pellicle walls 12a, 12b, 12c, 12d that define a trapezoidal area 14 therein. As used herein, a "trapezoidal" area is an area having the shape of a quadrilateral with at least one pair of parallel sides. While the trapezoidal area 14 of pellicle 10 is most often a parallelogram, such as a rectangle or a square, as shown in FIGS. 1 and 3 and in actual practice, it is not required to be a parallelogram. More importantly, the trapezoidal area 14 is sized and shaped to correspond to a pattern area of a lithographic photomask, as described more clearly below with reference to FIG. 3.

As also shown in FIG. 1, the pellicle 10 has a pellicle film 16 extending across the trapezoidal area 14 and affixed to a film-side edge 18 of the pellicle frame 12. Any conventional pellicle film 16, known now or in the future to persons of ordinary skill, may be used. More particularly, the pellicle film 16 is made of a material that, as is more clearly shown in FIG. 2, allows light (see arrows L) to pass through to the pattern area 20 of the photomask 22. Different pellicle film materials allow light of different wavelengths to pass through and, therefore, the film material is selected based on the type of photomask and photoresist materials with which the pellicle will be used during the manufacture process. Thus, selection of suitable material for the pellicle film 16 is within the ability of persons of ordinary skill in the relevant art. Suitable film materials include, for example without limitation, cellulose nitrate, cellulose acetate, fluorine-containing resin, and other polymer materials, etc. The pellicle frame 12 has a mask-side edge 34, opposite the film-side edge 18, that can be used to affix the pellicle 10 to a photomask (see, e.g., FIGS. 2 and 3). For example, an adhesive material may be applied to the mask-side edge 34 for affixing the pellicle 10 the photomask.

Returning to FIG. 1, any one of the four pellicle walls 12a, 12b, 12c, 12d, such as the wall 12b, has a vent hole 24 therethrough (shown in FIGS. 1 and 3). A filter 32 may be used to cover the vent hole 24. The vent hole 24 is located proximate the corner 26 of the frame 12 formed by the pellicle wall 12b having the vent hole 24 and an adjacent pellicle wall 12a. This position for the vent hole 24 is different from where the vent hole 24 is typically placed in conventional pellicles, which is in the middle or center portion of a pellicle wall 12b, as shown for example in phantom 28 in FIG. 1. The usual positioning of the vent hole 24 in the middle of the pellicle wall 12b allows any foreign matter that makes it through the vent hole 24 to enter in the middle portion of the trapezoidal area 14 defined by the pellicle frame 12, which should be the most protected and clearest section of the trapezoidal area 14, since it is typically centered above the pattern area of a photomask (see, e.g., FIG. 3). Moving the vent hole 24 to proximate a corner 26 of the pellicle frame 12 causes any foreign matter, such as dust or other particles, that inadvertently passes through the vent hole 24 to land, or remain floating, remotely from the more critical central portion of the trapezoidal area 14.

It has been found that locating the vent hole 24 proximate the corner 26 of the pellicle frame wall 112b ensures that, if foreign matter passes through the vent hole 24, that foreign matter will not obstruct the pattern area of the lithographic photomask. Therefore, the vent hole is located a distance (d) from the corner 26 of the pellicle frame 12. The distance (d) is such that should any foreign matter, such a dust particle, pass through the vent hole 24, it will land, or remain floating, remotely from the central portion of the trapezoidal area 14. In one embodiment, distance (d) is about 33 percent (%) of the total length (indicated by 30 in FIG. 1) of the pellicle wall 12b having the vent hole 24, where the distance (d) is measured from the corner 26. In other embodiments, without limitation, the distance (d) from the corner 26 is about 25%, or 20%, or even 15%, of the total length (indicated by 30 in FIG. 1) of the pellicle wall 12b. The phrase "located no more than a distance (d) from the corner," as used herein means that the entire vent hole 24 is within the distance (d) from the corner 26. As an example, if the frame wall 12b having the vent hole 24 is 15 mm, then the distance (d) is about 5 mm, and the vent hole is "proximate the corner" as long as the entire vent hole 24 is located between the corner 26 and a distance 5 mm from the corner 26. The shape of the vent hole 24 is not particularly limited and may, therefore, be curvilinear, such as round, oval, circular, or irregular, as well as multilateral including, without limitation, quadrilateral, triangular, octagonal, etc.

Figure 2:
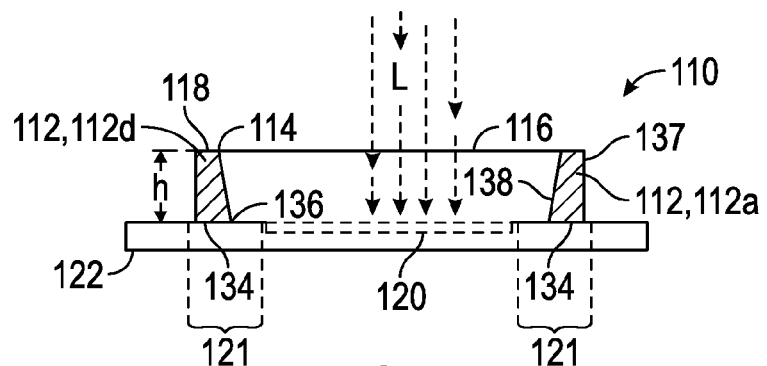
FIG. 2 is a cross-sectional side view of another embodiment of a pellicle which is affixed to a photomask (not shown in cross-section)

In other exemplary embodiments, a device is provided, as those shown in FIGS. 2 and 3, which include a lithographic photomask 122 having a pattern area 120 and a pellicle 110 affixed to the photomask 122 to protect the pattern area 120. More particularly, FIG. 2 shows the pellicle 110 in cross-section, and the photomask 122 in simple side view. The pellicle frame 112 has a mask-side edge 134, opposite the film-side edge 118. The pellicle 110 is affixed to the photomask 122, for example, using adhesive (not shown) between the mask-side edge 134 of the frame 112 and the surface of the photomask 122. More particularly, a peripheral border area 121 (most clearly shown lying between dotted lines on FIG. 3) surrounds the pattern area 120 of the photomask 122 and the mask-side edge 134 of the pellicle frame 112 is affixed within this peripheral border area 121 to avoid obstructing or damaging the pattern area 120. In some embodiments, the pellicle 110 may include adhesive (not shown per se) on the mask-side edge 134 of the pellicle frame 112, and the adhesive may be covered by a strip of non-adhesive material (also not shown per se) which covers the adhesive until it is time to affix the pellicle 110 on to the photomask 122.

As also shown in FIG. 2, the pellicle frame 112 has a height (h), extending between the film-side 118 and the mask-side edges 134, that determines the distance between the pellicle film 116 and the surface of the photomask 122. There is no contact between the pellicle film 116 and the photomask 122 or the pattern area 120 thereon. In an exemplary embodiment, a height for the pellicle frame 112 and, therefore also for the pellicle 110, is in the range of from about 3 millimeters (mm) to about 5 mm.

As explained earlier, a pellicle having a frame with walls of uniform width will have a trapezoidal area defined by the frame, but a peripheral portion of that trapezoidal area will be obstructed by shadow cast by the pellicle walls. To eliminate this shadow and render the entire trapezoidal area 136 defined by the mask-side edge 134 of the pellicle frame 112 unobstructed and inspectable, the film-side edge 118 of the frame 112 has a width that is up to about 20% smaller than the width of the mask-side edge 134. As shown in FIG. 2, while the exterior wall surface 137 of the frame may remain perpendicular to the surface of the photomask 122, the inner wall surface 138 of the pellicle frame 112 is sloped. For example, without limitation, if the width of the mask-side edge 134 of the frame 112 is 2 mm, then the width of the film-side edge 118 should be in the range of from about 1.6 mm to less than about 2 mm. As a result of the sloped inner wall surface 138, the mask-side edge 134 defines an unobstructed trapezoidal area 136 that is smaller than, and fits entirely within, the trapezoidal area 114 defined by the film-side edge 118. Generally, the width of the mask-side edge 134 of the frame 112 should be within a range of from about 1.5 to about 2.5 mm.

FIG. 3 provides a top plan view of the embodiment shown in FIG. 2 wherein the entire pellicle 110 can be seen affixed to the lithographic photomask 122. In particular, the photomask 122 comprises a pattern area 120 and a peripheral border area 121 (indicated by dotted lines) extending around the pattern area 120. The pellicle 110 is affixed to the photomask 122, for example, with adhesive applied between the mask-side edge (not visible in FIG. 3, but see, e.g., mask-side edge 34 in FIG. 2) of the pellicle frame 112 and the peripheral border area 121 that surrounds the pattern area 120. As mentioned, the peripheral border area 121 provides a location for affixing the pellicle 110 to the photomask 122, aligning the trapezoidal areas 114, 136 with the pattern area 120, while avoiding damage or other obstruction to the pattern area 120.

As in the embodiment described above in connection with FIG. 1, the embodiment of FIG. 3 shows the vent hole 124 located a distance (d) from the corner 126 of the pellicle frame 12, where the distance (d) is such that should any foreign matter, such a dust particle, pass through the vent hole 24, it will land, or remain floating, remotely from the central portion of the trapezoidal area 14. Consequently, if foreign matter passes through the vent hole 124, the foreign matter will not obstruct the pattern area 120 during use of the lithographic photomask 122. Distance (d) may, for example without limitation, be about 33 percent (%), or 25%, or 20% or even 15%, of the total length (indicated by 30 in FIG. 1) of the pellicle wall 12b having the vent hole 24, where the distance (d) is measured from the corner 26. The phrase "located no more than a distance (d) from the corner," as used herein means that the entire vent hole 24 is within the distance (d) from the corner 26.

In addition, the top plan view shown in FIG. 3 more clearly shows the relationship between a sloped inner wall surface 138 that is formed when the film-side edge 118 of the frame 112 has a width that is up to about 20% smaller than the width of the mask-side edge (not visible in FIG. 3, but see, e.g., mask-side edge 134 in FIG. 2), and the smaller unobstructed trapezoidal area 136 defined by the mask-side edge, and the larger trapezoidal area 114 defined by the film-side edge 118. As with the embodiment shown in FIG. 1, the exterior wall surface of the pellicle frame 112 of the pellicle shown in FIG. 3 may be perpendicular to the surface of the photomask 122, although this need not be the case.

In some embodiments, the pellicle 110 of FIG. 3 also has a planar baffle 140 positioned within the trapezoidal area 114, 136, proximate the same corner 116 of the pellicle frame 112 to which the vent hole 124 is proximate. The planar baffle 140 has a height (not visible in the view of FIG. 3) approximately the same as the height of the pellicle frame 112 (not visible in FIG. 3, but see, e.g., height (h) in FIG. 2). Furthermore, the planar baffle 140 is affixed to the pellicle wall 112b having the vent hole 124 or to the adjacent pellicle wall 112a that forms the corner 116. The planar baffle 140 extends from either pellicle wall 112b or wall 112a across the vent hole 124, without completely blocking it. The planar baffle 140 may, for example as shown in FIG. 3, extend at an angle across the vent hole toward the other wall. In this position and orientation, the baffle 140 is in the path of any foreign material that may enter the trapezoidal area 114, 136 through the vent hole 124 and prevent such foreign matter from entering or settling in (or floating above) the pattern area 120 of the photomask 122. In this manner, the baffle 140 renders the strict adherence to the pellicle manufacturer's limitations on the nitrogen or air blowing procedure less important for preventing foreign matter from entering the vent hole and settling in or floating above the pattern area 120 of the photomask 122.

It is noted that the various advantageous features of the pellicle described herein are not necessary for one another to function and, therefore, may be present individually, or in combination, with realization of the advantages and benefits from each as described above. For instance, in some embodiments such as that shown in FIG. 1, the pellicle may include a vent hole in its relocated position proximate a corner of the frame, without other improvements described herein. In other embodiments, also in accordance with the pellicle described and contemplated herein, the pellicle may include the vent hole in its relocated position, as well as a tapered inner wall surface of the frame formed by having a film-side edge with a width that is up to 20% less than the width of the oppositely positioned mask-side edge of the pellicle frame. Alternatively, in other embodiments, the pellicle may include the tapered inner wall surface of the frame, but without the vent hole proximate a corner of the pellicle frame (i.e., the vent hole is in the more familiar position in the middle of a wall of the pellicle frame).

Furthermore, in other embodiments, such as that shown in FIG. 3, in addition to the vent hole in a relocated position proximate a corner of the pellicle frame and a tapered inner wall surface of the frame to ensure an unobstructed and inspectable trapezoidal area defined by the pellicle frame, the pellicle may further include a planar baffle affixed either to the pellicle wall having the vent hole or to the adjacent pellicle wall that forms the corner, such that the baffle extends across the vent hole without completely blocking it. Alternatively, some embodiments may include only the vent hole in a relocated position proximate the corner of the pellicle frame, along with the baffle, but without the tapered inner wall surface for the pellicle frame. It is further noted, that even in pellicles having the vent hole in the more familiar position in the middle of a wall of the pellicle frame, a planar baffle may still be present, i.e., attached at one end thereof to the inner surface of the frame wall having the vent hole and extending across the vent hole at a distance from the frame wall having the vent hole. In such a position and orientation, the baffle will still be able to block and provide an obstruction to foreign matter that may inadvertently enter the vent hole. Such embodiments may or may not also include the tapered inner wall surface of the frame which provides an unobstructed and inspectable trapezoidal area defined by the pellicle frame.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A pellicle comprising:
   a pellicle frame comprising four pellicle walls that define a trapezoidal area sized and shaped to correspond to a pattern area of a lithographic photomask; and
   a pellicle film extending across the trapezoidal area and affixed to a film-side edge of the pellicle frame;
   wherein any one of the four pellicle walls has a vent hole therethrough, the vent hole being located a distance (d) from a corner of the frame; and
   a baffle positioned within the trapezoidal area, wherein the baffle extends across the vent hole without completely blocking the vent hole.

2. The pellicle of claim 1, wherein the baffle is affixed to the pellicle wall having the vent hole or to an adjacent pellicle wall.

3. The pellicle of claim 1, wherein the distance (d) is about 25 percent (%) of the total length of the pellicle wall having the vent hole.

4. The pellicle of claim 1, wherein a filter covers the vent hole.

5. The pellicle of claim 1, wherein the baffle and the pellicle wall having the vent hole define a gap therebetween.

6. The pellicle of claim 1, wherein the pellicle frame has a mask-side edge, opposite the film-side edge, wherein the mask-side edge has an adhesive applied thereon.

7. The pellicle of claim 1 wherein the baffle is planar.

8. The pellicle of claim 1, wherein the pellicle frame has a height extending between the film-side edge and an oppositely located mask-side edge of the pellicle frame, and the baffle has a height approximately the same as the height of the pellicle frame.

9. The pellicle of claim 1, wherein the pellicle frame has a mask-side edge opposite the film-side edge, and wherein the film-side edge has a width that is smaller than the mask-side edge.

10. The pellicle of claim 9, wherein the four pellicle walls comprise an exterior wall surface and an interior wall surface, wherein the exterior wall surface is about perpendicular to the pellicle film and the interior wall surface is sloped relative to the pellicle film.

11. A pellicle comprising:
    a pellicle frame comprising four pellicle walls that define a trapezoidal area sized and shaped to correspond to a pattern area of a lithographic photomask; and
    a pellicle film extending across the trapezoidal area and affixed to a film-side edge of the pellicle frame;
    wherein the film-side edge of the pellicle frame has a width that is smaller than a width of a mask-side edge of the pellicle frame located opposite the film-side edge; and
    wherein the four pellicle walls comprise an exterior wall surface and an interior wall surface, wherein the exterior wall surface is about perpendicular to the pellicle film and the interior wall surface is sloped relative to the pellicle film.

12. The pellicle of claim 11, wherein the four pellicle walls have quadrilateral cross sections.

13. The pellicle of claim 11, wherein any one of the four pellicle walls has a vent hole therethrough, the vent hole being located a distance (d) from a corner of the frame, wherein if foreign matter passes through the vent hole, the foreign matter will not obstruct the pattern area during use of the lithographic photomask.

14. The pellicle of claim 13, wherein the distance (d) is about 33 percent (%) of the total length of the pellicle wall having the vent hole.

15. The pellicle of claim 14, further comprising a planar baffle positioned within the trapezoidal area and affixed to the pellicle wall having the vent hole or the adjacent pellicle wall, wherein the planar baffle extends across, but does not completely block, the vent hole.

16. The pellicle of claim 15, wherein the pellicle frame has a height extending between the film-side and the mask-side edges and the planar baffle has a height approximately the same as the height of the pellicle frame.

17. A device comprising:
    a lithography photomask comprising a pattern area and a peripheral border area extending around the pattern area; and
    a pellicle affixed to the photomask and comprising:
    a pellicle frame comprising four pellicle walls that define a trapezoidal area sized and shaped to correspond to the pattern area of the lithographic photomask;
    a pellicle film extending across the trapezoidal area and affixed to a film-side edge of the pellicle frame; and
    a mask-side edge of the pellicle frame opposite the film-side edge;
    wherein any one of the four pellicle walls has a vent hole therethrough; and
    wherein the pellicle is affixed to the photomask between the mask-side edge of the pellicle frame and the peripheral border area of the photomask; and
    a baffle positioned within the trapezoidal area, wherein the baffle extends across the vent hole without completely blocking the vent hole.

18. The device of claim 17, wherein the baffle is planar.

19. The device of claim 17, wherein the baffle is affixed to the pellicle wall having the vent hole or an adjacent pellicle wall.

20. The device of claim 17, wherein wherein the four pellicle walls comprise an exterior wall surface and an interior wall surface, wherein the exterior wall surface is about perpendicular to the photomask and the interior wall surface is sloped relative to the photomask.

* * * * *